United States Patent [19]

Iizuka

[11] Patent Number: 5,585,751

[45] Date of Patent: Dec. 17, 1996

[54] FREQUENCY CONTROL CIRCUIT OF FM MODULATOR

[75] Inventor: Hiroshi Iizuka, Gunma, Japan

[73] Assignee: Sanyo Electric Co., Inc., Osaka, Japan

[21] Appl. No.: 589,996

[22] Filed: Jan. 23, 1996

Related U.S. Application Data

[63] Continuation of Ser. No. 184,468, Jan. 21, 1994, abandoned.

[30] Foreign Application Priority Data

Jan. 28, 1993 [JP] Japan .................................. 5-012571

[51] Int. Cl.⁶ .......................... H03B 21/00; H03K 3/282
[52] U.S. Cl. ....................... 327/113; 327/100; 327/101; 327/129; 327/407; 332/135; 331/113 R; 331/177 R; 331/179; 341/144
[58] Field of Search .......................... 328/27; 307/271, 307/270, 494, 259; 332/135; 331/113 R, 177 R, 179; 341/144, 143

[56] References Cited

U.S. PATENT DOCUMENTS

| | | | |
|---|---|---|---|
| 2,986,654 | 5/1961 | Gunning | 327/411 |
| 3,902,140 | 8/1975 | Grebene | 331/113 R |
| 3,909,748 | 9/1975 | Yuan et al. | 331/177 R |
| 4,271,499 | 6/1981 | Leveque | 370/7 |
| 4,595,885 | 6/1986 | Prieto et al. | 330/303 |
| 4,600,897 | 7/1986 | Koga et al. | 331/113 R |
| 4,670,721 | 6/1987 | Gontowski, Jr. et al. | 331/44 |
| 5,126,740 | 6/1992 | Kawada | 341/144 |

FOREIGN PATENT DOCUMENTS

| | | |
|---|---|---|
| 3440879 | 5/1985 | Germany . |
| 53-34449 | 3/1978 | Japan . |
| 8202301 | 7/1982 | WIPO ................................. 307/259 |

OTHER PUBLICATIONS

Kato, Kazuo, et. al., "A Low–Power 128–MHz VCO for Monolithic PLL IC's", I.E.E.E. Journal of Solid–State Circuits, vol. 23. No. 2, Apr. 1988, N.Y., pp. 474–479.

IBM Technical Disclosure Bulletin, "Voltage Controlled Oscillator Frequency Switch", vol. 31, No. 5, Oct. 1988, N.Y., p. 235.

*Primary Examiner*—Timothy P. Callahan
*Assistant Examiner*—Dinh T. Le
*Attorney, Agent, or Firm*—Loeb & Loeb LLP

[57] ABSTRACT

A frequency control circuit of an FM modulator with a small number of external parts and a low number of IC pins, including a non-linear D/A converter, a current generator circuit and an emitter-coupled multivibrator. The non-linear D/A converter for giving an analog optimum resistance value depending on digital frequency control signals includes a plurality of resistors weighted by $K^n$ (1<K<2 and n is a sequential natural number). The current generator generates a current $\Delta I$ depending on the output resistance value of the non-linear D/A converter. An oscillating frequency of the multivibrator is determined in proportional to $I_o/4CF\Delta I$ ($I_o$ represents a current value of an operational current source, C represents a capacitance of a capacitor, R represents a resistance value of a resistor and $\Delta I$ represents a current flowing in the resistor). When the oscillating frequency is controlled depending on $\Delta I$, a value of a frequency deviation can be changed almost linearly to readily carry out the control.

22 Claims, 6 Drawing Sheets

FREQUENCY CONTROL CIRCUIT OF FM MODULATOR

This is a continuation of application Ser. No. 08/184,468, filed Jan. 21, 1994, now abandoned.

BACKGROUND OF THE INVENTION i) Field of the Invention

The present invention relates to a frequency control circuit of an FM modulator, and more particularly to a frequency control circuit of an FM modulator with a small number of external parts and low number of IC pins.

ii) Description of the Related Arts

Conventionally, a multivibrator type of oscillation circuit is known. When this kind of oscillation circuit is used for an FM (frequency modulator) modulator, there must be sufficient linearity between an input voltage and an oscillating frequency. For example, in a VTR (video tape recorder), if this linearity is bad, distortion occurs in reproduced video signals which is likely to cause degradation of reproduced image quality.

Figure 1:
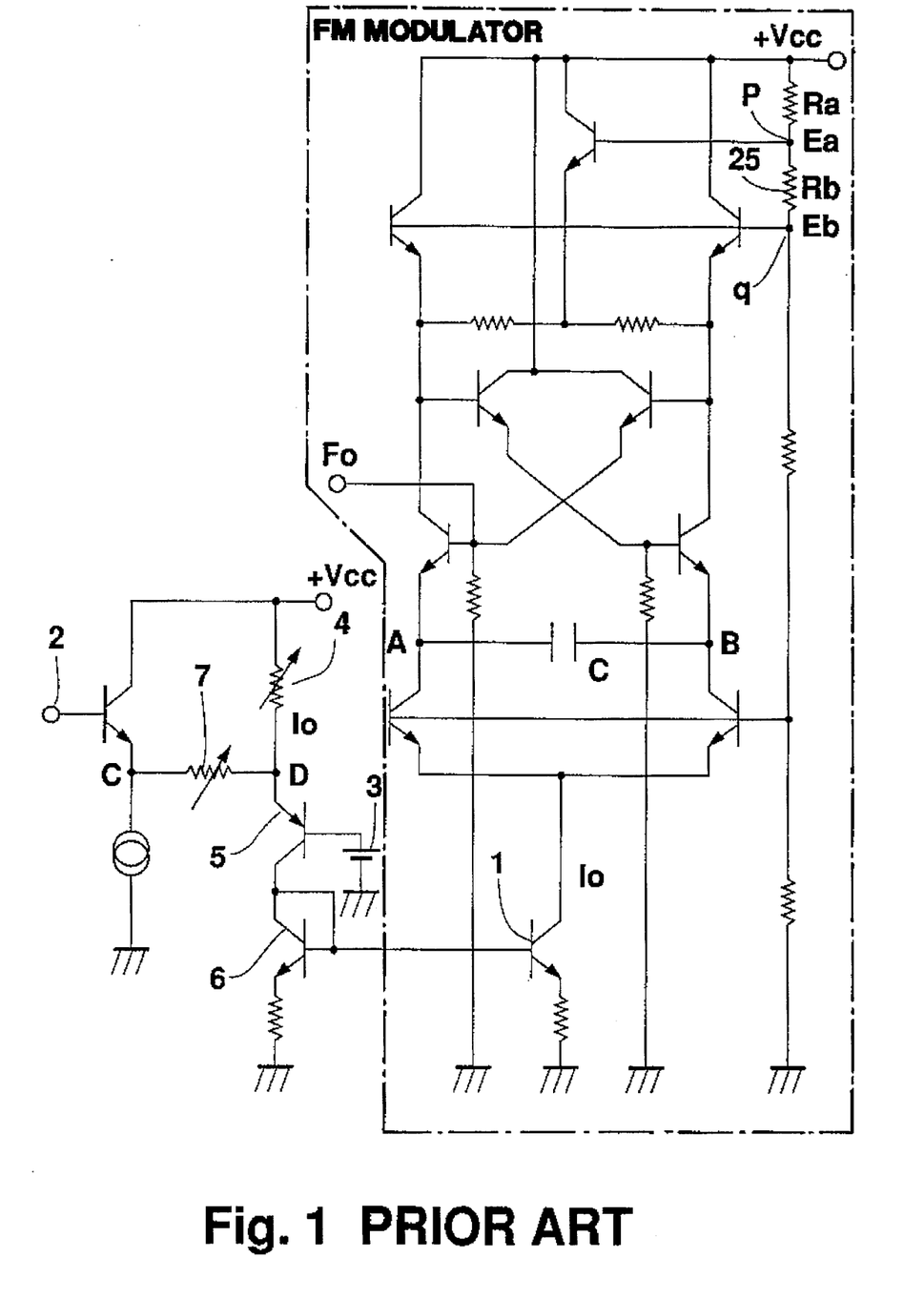
FIG. 1 is a circuit diagram showing a conventional frequency control circuit of an FM modulator.
Figure 2A:
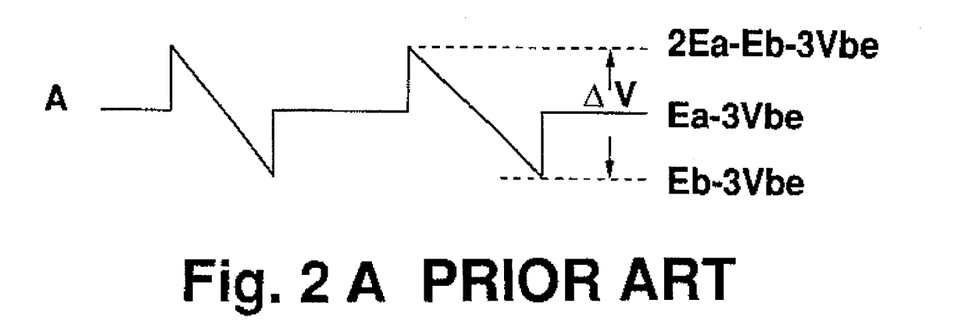
FIG. 2 is a schematic view showing waveforms of signals appearing in the circuit shown in FIG. 1.
Figure 2B:
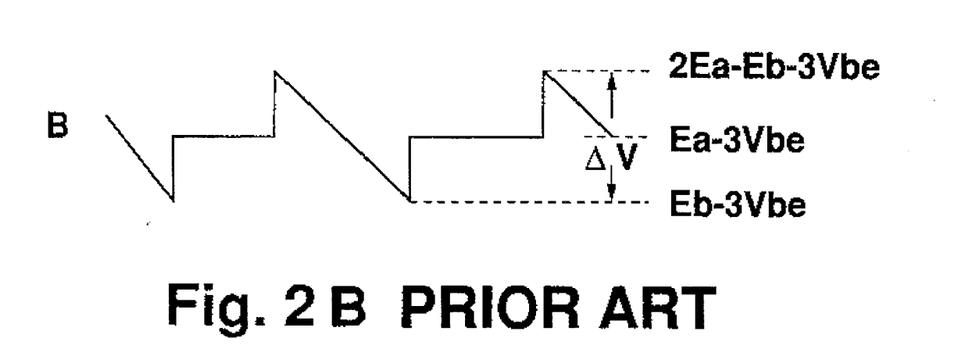

In FIG. 1, there is shown a conventional, frequency control circuit of an FM modulator along with an oscillation circuit using an emitter-coupled multivibrator, as disclosed in Japanese Patent Publication No. Sho 59-30337. In this oscillation circuit, an oscillating frequency $F_o$ is expressed as follows.

$$F_o = \frac{I_o}{2C\Delta V} \quad (1)$$

wherein $I_o$ represents the collector current of transistor 1, C represents the capacitance of the capacitor connected between two points A and B, and $\Delta V$ represents the crest value of the waveform obtained at the point A or B. Now, assuming that electric potentials at connection points p and q are Ea and Eb, respectively, the crest value $\Delta V$ of the voltage obtained at the points A and B is expressed as follows.

$$\Delta V = 2(Ea-Eb) \quad (2)$$

Hence, the capacitance C and the crest value $\Delta V$ in formula 1 become constants and thus the oscillating frequency $F_o$ is proportional to the collector current $I_o$.

In FIG. 1, video signals (luminance signals) are applied to an input terminal 2. The value of the electric power source 3 is determined so that the DC potential at points C and D may be equal. A first variable resistor 4 determines the oscillating frequency at no input signal time, that is, the current value $I_o$ in FIG. 1. The current $I_o$ flows to transistor 6 via transistor 5. Therefore, the current $I_o$ also flows to transistor 1 connected to transistor. 6 with a current mirror relationship. As a result, the oscillation circuit oscillates at a constant frequency $F_o$. When the video signal is applied from the no input signal state (e.g., zero volts), a signal current flows in a second variable resistor 7 and the emitter current of the transistor varies. Thus, a variable current part is added or subtracted to dr from the current $I_o$ and the oscillating frequency is varied. At this time, the voltage at the point D is not changed and hence the oscillating frequency can be precisely changed depending on the video signal.

However, in the frequency control method in FIG. 1, since the variable resistors are required, adjusting work is required in a fabricating process and external parts of an IC and pins are required.

SUMMARY OF THE INVENTION

It is therefore an object of the present invention to provide a frequency control circuit of an FM modulator in view of the problems of the prior art, which is capable of readily carrying out frequency control of an FM modulator without requiring any external parts and extra pins to be connected to an IC and simplifying a fabrication process.

A frequency control circuit of a frequency modulation modulator according to the present invention comprises (a) a non-linear D/A converter including a plurality of resistors weighted by $K^n$ (n is a sequential natural number) for giving an analog resistance value depending on digital frequency control signals; (b) current generator means connected to the non-linear D/A converter for generating a current $\Delta I$ depending on the resistance value of the non-linear D/A converter; and (c) an emitter-coupled multivibrator connected to the current generator means for generating an oscillating signal having an oscillating frequency determined in proportional to $I_o/4CR\Delta I$ ($I_o$ represents a current value of an operational current source, C represents the capacitance of a capacitor, R represents the resistance value of a resistor and $\Delta I$ represents the current flowing through a resistor), in which the oscillating frequency of the emitter-coupled multivibrator is controlled depending on the output current $\Delta I$ of the current generator means.

In the frequency control circuit, K is preferably set in a range of 1<K<2.

In the frequency control circuit, the non-linear D/A converter can include the resistors weighted by $K^n$ connected in parallel and a plurality of switch means connected in series to the respective resistors and one ends of the resistors are connected to the current generator means.

In the frequency control circuit, either ON or OFF of the switch means can be decided by zapping.

The switch means further includes a switch transistor having a base terminal, a collector terminal and an emitter terminal which are connected to a power source, the resistor weighted by $K^n$ and an earth, respectively; a diode connected to the switching transistor in parallel so as to be reverse biased; and a control pad connected to one end of the diode, and the digital frequency control signal is applied to the control pad to turn the switching transistor on or off.

In the frequency control circuit, the digital frequency control signal is a control signal of a frequency deviation.

According to the present invention, by using the non-linear D/A converter including a plurality of resistors weighted by $K^n$ (n is a sequential natural number), a modulation sensitivity of the emitter-coupled multivibrator is controlled to carry out the frequency control of the FM modulator.

BRIEF DESCRIPTION OF THE DRAWINGS

The objects, features and advantages of the present invention will become more apparent from the consideration of the following detailed description, taken in conjunction with the accompanying drawings, in which.

DESCRIPTION OF THE PREFERRED EMBODIMENTS

The present invention will now be described in connection with its preferred embodiments with reference to the accompanying drawings, wherein the same parts as those described above in connection with the conventional embodiment are designated by the same reference characters and thus the repeated description thereof can be omitted for brevity.

Figure 3:
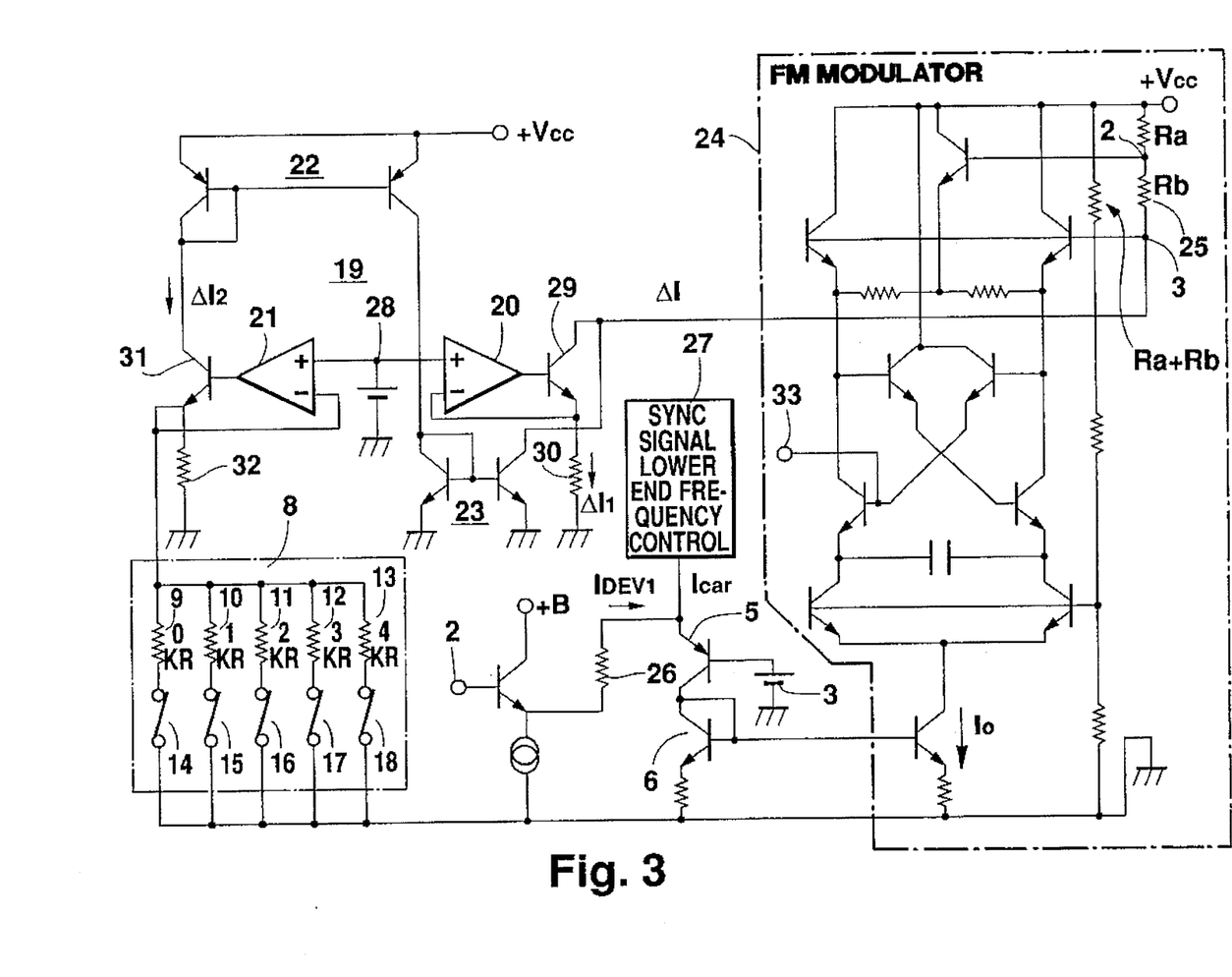
FIG. 3 is a circuit diagram showing a frequency control circuit of an FM modulator according to the present invention.

In FIG. 3, there is shown one embodiment of a frequency control circuit of an FM (frequency modulation) modulator according to the present invention.

As shown in FIG. 3, a non-linear D/A (digital-analog) converter 8 for giving an optimum resistance value is composed of first to fifth resistors 9 to 13 and first to fifth switches 14 to 18 connected in series thereto, respectively, which are opened or closed in response to digital frequency control signals. A current generator 19 includes a first operational amplifier 20 for generating a minimum value current, a second operational amplifier 21 for generating a current depending on the output resistance value of the non-linear D/A converter 8, and first and second current mirror circuits 22 and 23 for mixing the output current of the second operational amplifier 21 and the minimum value current output from the first operational amplifier 20. In the FM modulator 24, the voltage across resistor 25 changes depending on the output current $\Delta I$ of the current generator 19 and thus the oscillation sensitivity (the variation of the oscillating frequency/the control signal) changes. A fixed resistor 26 determines a frequency deviation of the FM modulator 24, and a synchronous signal lower end frequency control circuit 27 generates a current for determining a central frequency of the FM modulator 24.

In FIG. 3, when the oscillating frequency of the FM modulator 24 is controlled, first, a control (in the case of image signals, 1 MHz width) of the frequency deviation is carried out and then a control of the central frequency (central frequency is a head value of a synchronous signal and is determined to be 3.4 MHz in the present invention) is executed to obtain the desired characteristics.

That is, from formulas (1) and (2), the oscillating frequency $F_o$ of the FM modulator 24 is obtained as follows.

$$F_o = \frac{I_o}{4c(Ea - Eb)} \tag{3}$$

In formula (3), $I_o$ is expressed as follows.

$$I_o = I_{car} + I_{DEV} \tag{4}$$

wherein $I_{car}$ represents a current at no input signal (e.g., zero volts) (synchronous lower end frequency) and $I_{DEV}$ represents a deviation current at a signal apply time.
Also, $$Ea - Eb = \Delta IRb \tag{5}$$

By substituting formulas (4) and (5) for formula (3), the oscillating frequency $F_o$ is obtained as follows.

$$F_o = \frac{I_{car} + I_{DEV}}{4C\Delta IRb} \tag{6}$$

In this embodiment, the capacitance C, the resistance value Rb and the current value $I_{DEV}$ are determined to fixed values and by controlling the variation part of the fixed values by the current $\Delta I$, the oscillating frequency is restored to the correct value. In this way, the control of the frequency deviation is performed. Thereafter, the current $I_{car}$ is controlled to determine the central frequency. As a result, the desired frequency characteristics can be obtained.

Next, the above-described control will now be described more specifically.

In FIG. 3, the resistor 26 for determining the frequency deviation has a fixed value. Now, assuming that a deviation current is $I_{DEV1}$ when a maximum level of signal is applied to the input terminal 2, the frequency deviation $F_{DEV}$ is obtained as follows.

$$F_{DEV} = \frac{I_{car} + I_{DEV1} - I_{car}}{4C\Delta IRb} = \frac{I_{DEV1}}{4C\Delta IRb}, \tag{7}$$

Then, the value of, the current $\Delta I$ is determined so that the value of formula 7 may be exactly 1 MHz.

The current $\Delta I$ is calculated by adding the output current of the first operational amplifier 20 and the output current of the second operational amplifier 21 and determines the maximum oscillating frequency width (approximately 1.2 MHz). That is, a current $\Delta I_1$ obtained by dividing a voltage of the reference power source of the first operational amplifier 20 by a resistor 30 flows to a collector of the transistor 29. In an initial state of the control, all of the first to fifth switches 14 to 18 of the non-linear D/A converter 8 are closed. Hence, a maximum current $\Delta I_2$ determined by the first to fifth resistors 9 to 13 of the non-linear D/A converter 8 flows to a collector of a transistor 31 of the second operational amplifier 21.

In this case, a current flowing in a resistor 32 is a negligible value in comparison with the current $\Delta I_1$. The current $\Delta I_2$ flows via the first and second current mirror circuits 22 and 23 and is added to the current $\Delta I_1$.

From this state, the first to fifth switches 14 to 18 are opened to reduce the value of the current $\Delta I_2$ and thus to reduce the output current $\Delta I$ and hence the current flowing in the resistor 25 is reduced. By lowering the voltage drop, the denominator of formula (7) is decreased and thus the frequency deviation is enlarged. When all the first to fifth switches 14 to 18 are closed, the resistance value of the non-linear D/A converter 8 is determined so that the value of formula (7) may be approximately 800 kHz. Accordingly, by applying the maximum amplitude of the video signal (a test signal for controlling) to the input terminal 2, a frequency change of the aforementioned 800 KHz is caused on an output terminal 33. Then, the above-described frequency of 800 KHz is compared with the desired value of 1 MHz by using a control circuit such as a microcomputer or the like and depending on its error value, the first to fifth switches 14 to 18 are opened. Hence, the current $\Delta I_2$ is reduced and further the current $\Delta I$ is lowered to increase the value of formula (7). In this increased value state, the comparison for the above-described frequency deviation control is executed again, and if there is an error value, the above-described current $\Delta I$ is further reduced. This operation is repeated until the value of formula (7) reaches 1 MHz.

Therefore, the frequency deviation of the FM modulator 24 shown in FIG. 3 is exactly and automatically controlled to 1 MHz. Thus, after this frequency deviation control, the current $I_{car}$ for setting the central frequency in formula (6) is determined by the synchronous signal lower end frequency control circuit 27 to obtain the desired characteristics.

In this embodiment, the non-linear D/A converter 8 and the synchronous signal lower end frequency control circuit 27 are arranged within an IC and are controlled by zapping and thus external parts to be connected to the IC are not required.

Concerning the zapping, an diode is connected to a pad within an IC and by causing an overcurrent to flow to the diode from the pad, the diode is made broken or not broken to obtain two different voltages. Depending on these two voltages, a transistor switch is turned on or off.

Figure 4:
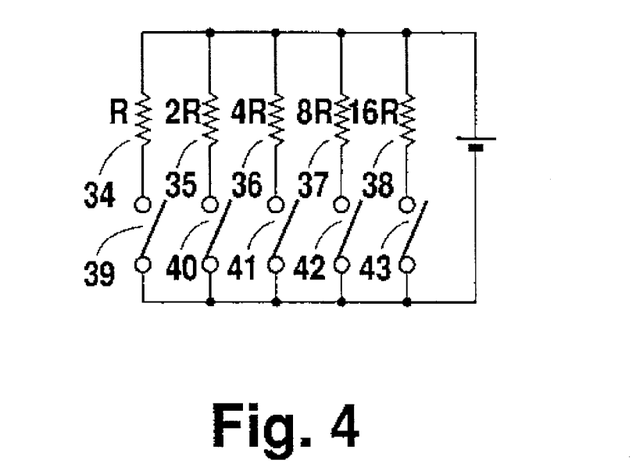
FIG. 4 is a circuit diagram showing a synchronous signal lower end frequency control circuit shown in FIG. 3.
Figure 5:
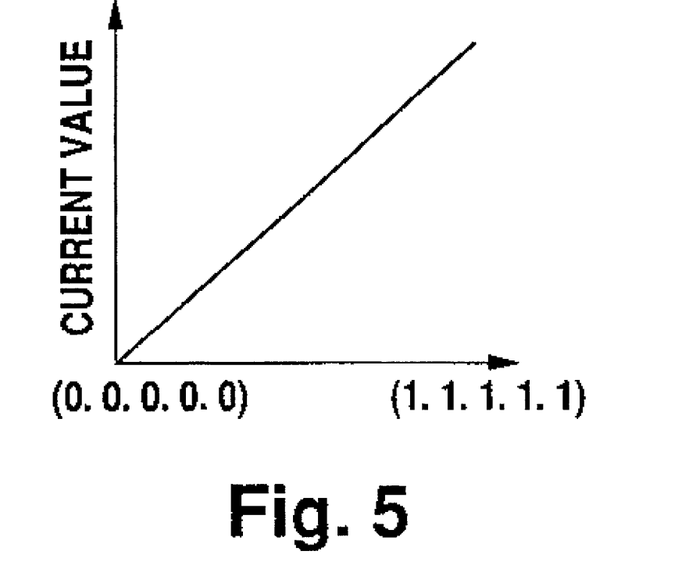
FIG. 5 is a graphical representation showing a relationship between a current value and digital signals in the circuit shown in FIG. 3.

FIG. 4 illustrates one embodiment of the synchronous signal lower end frequency control circuit 27 shown in FIG. 3. Factor values of first to fifth resistors 34 to 38 connected in parallel are determined to $2^n$ (n is a sequential natural number) and by digital control signals, first to fifth switches 39 to 43 connected to the respective first to fifth resistors 34 to 38 in series are closed to obtain a linear current value. This operation is shown in FIG. 5. Each switch is opened by a control signal "0" and closed by a control signal "1". 5 bits of digital control signals (0, 0, 0, 0, 0) to (1, 1, 1, 1, 1) are applied to the first to fifth switches 39 to 43, and the current flowing increases almost linearly (in fact, stepwise from a micro-scopic viewpoint) The current flowing in the circuit shown in FIG. 4 corresponds to the current $I_{car}$ existing in the numerator of Formula (6) and hence the current can be gradually increased to perform the frequency control.

Figure 6:
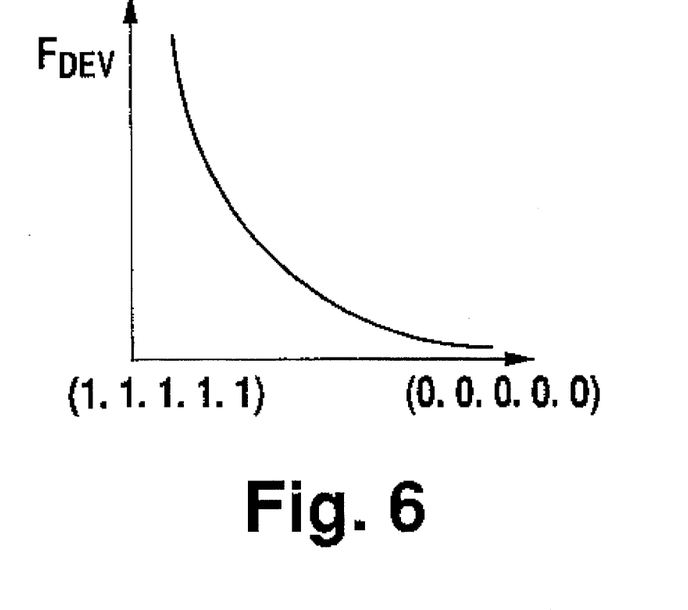
FIG. 6 is a graphical representation showing a relationship between a frequency deviation and digital signals in the circuit shown in FIG. 3.

On the other hand, when the resistance values of the non-linear D/A converter 8 shown in FIG. 4 are determined to be the same values as those of the non-linear D/A converter 8 shown in FIG. 3, that is, k=2 and the non-linear D/A converter 8 is operated, the value $F_{DEV}$ of formula (7) is not changed in the linear form, as shown in FIG. 5 but in a non-linear form shown in FIG. 6. The reason for this is that the output current of the current generator 19 depending on the output current $\Delta I_2$ is existent in the denominator of formula (7). Hence, the control amount per unit becomes not constant and the exact control can not be carried out.

Accordingly, according to the present invention, there is provided the non-linear D/A converter 8 wherein the current $\Delta I$ is varied so that the value of formula (7) may be linearly changed, as shown in FIG. 5. That is, the ratio of the resistance values of the first to fifth resistors 9 to 13 constituting the non-linear D/A converter 8 is determined to be $K^n$ so as to obtain the linear output value.

Figure 7:
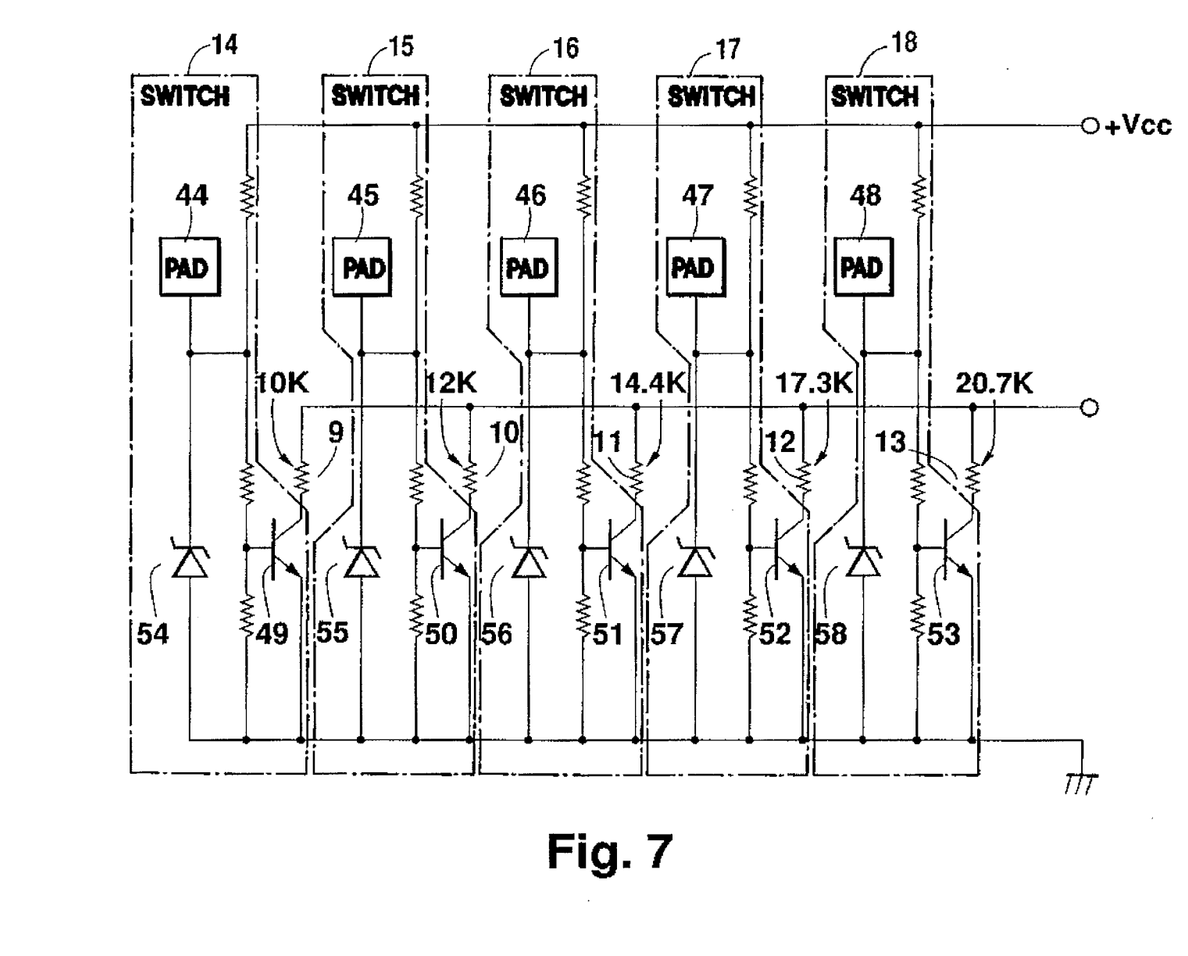
FIG. 7 is a circuit diagram showing a non-linear digital-analog converter used in the circuit shown in FIG. 3.

In FIG. 7, there is shown one embodiment of the non-linear D/A converter 8. As shown in FIG. 7, the resistance value to be a reference value is determined to 10 k$\Omega$ and K is 1.2. The control signals for the frequency deviation are applied to first to fifth pads 44 to 48 at an earth level or in the open form. In this case, first to fifth transistors 49 to 53 corresponding to the first to fifth switches 14 to 18 shown in FIG. 3 are turned on or off depending on the digital control signals to select the respective first to fifth resistors 9 to 13. For example, When the first to fifth pads 44 to 48 become the earth level, the first to fifth transistors 49 to 53 are all turned off and, when the first to fifth pads 44 to 48 become open, the first to fifth transistors 49 to 53 are all turned on.

Figure 8:
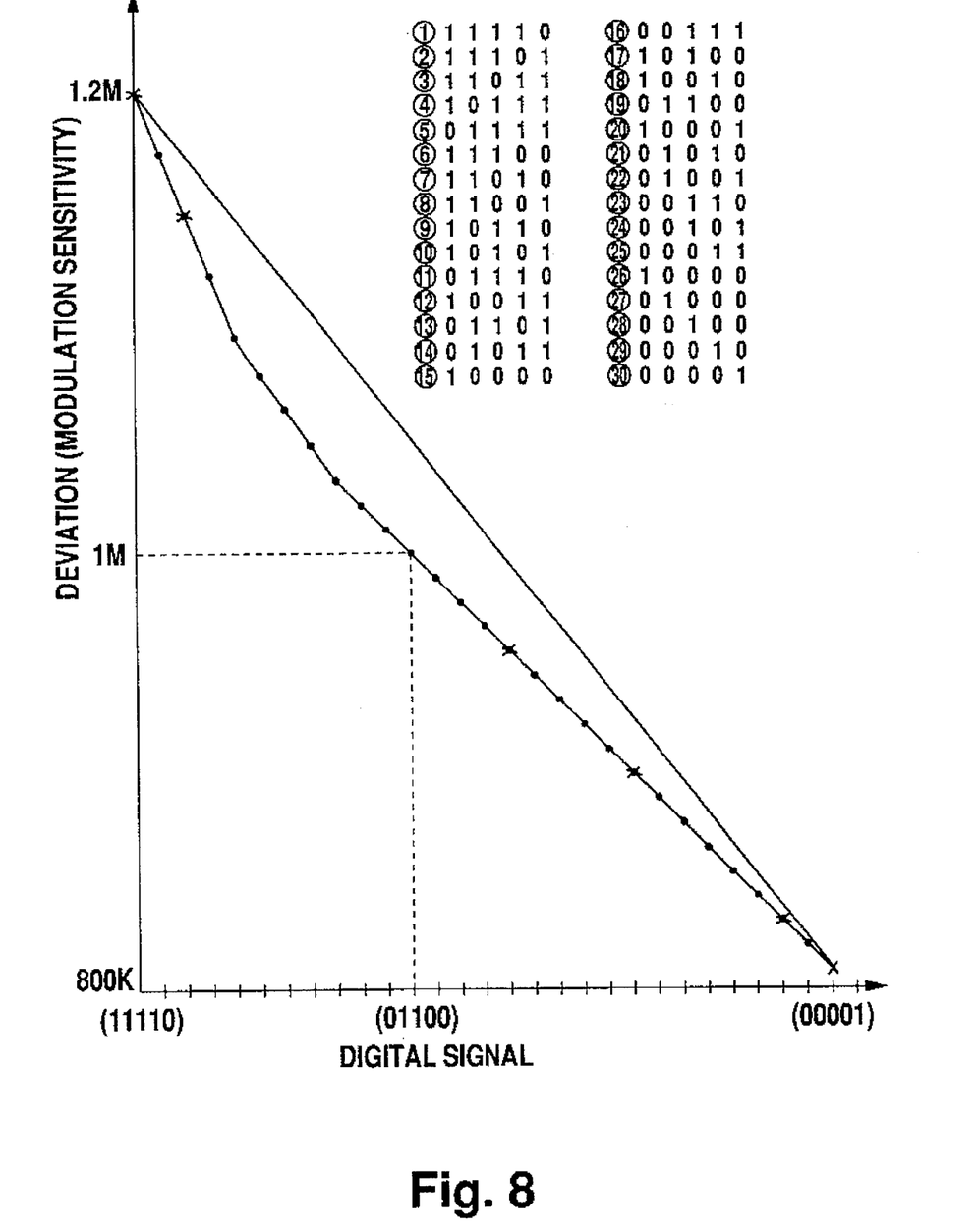
FIG. 8 is a graphical representation showing a variation of the frequency deviation when using the non-linear digital-analog converter shown in FIG. 7.

FIG. 8 shows the variation of the frequency deviation obtained by using the circuit shown in FIG. 7. In FIG. 8, a horizontal axis indicates the digital signals ("0" is the earth level and "1" is open) applied to the first to fifth pads 44 to 48, which are varied from (1, 1, 1, 1, 0) to (0, 0, 0, 0, 1). At this time, by the digital signal (0, 1, 1, 0, 0), the frequency deviation becomes 1 MHz. As is apparent from FIG. 8, by using the circuit shown in FIG. 7, an almost linear frequency deviation can be obtained. In this manner, how to apply the digital signals to the first to fifth pads 44 to 48 for obtaining nearly linear output is shown in FIG. 8. From the left hand side to the right hand side along the horizontal axis, the digital signals of the modes 1 to 30 are applied. As is clear from these digital values, the order of applying the digital signals is not necessarily regular. In order to improve the linearity of the curve shown in FIG. 8, it should have been clear to bring the value K closer to 1. However, if this is done, the application order of the digital signals shown in FIG. 8 becomes more irregular and the load of the control circuit such as the microcomputer for controlling this irregularity is increased. Also, for example, even if the value K is to be set to approximately 1.1, the difference between the resistors becomes almost none and it is difficult to set to the desired resistance value ratio due to an influence of errors caused at the time of production. Hence, as regards the value K, it is desirable to be set to 1<K<2, in practice but in this embodiment, in particular, it is set to K=1.2.

Next, the zapping will be described in connection with FIG. 7. As described above, for example, by applying the earth level or open signals to the first to fifth pads 44 to 48, it will be set to the state corresponding to the digital signal of (1, 0, 0, 1, 1), as shown in FIG. 8. In this case, a pulse form of overcurrent is applied to the second and third pads 45 and 46 to break the second and third diodes 50 and 51. When the diodes are broken, both the ends are short-circuited and the second and third transistors are turned off. As a result, no current flows in the second and third resistors 10 and 11. Thereafter, the second and third pads 44 and 46 are made open. Also, the first, fourth and fifth pads 44, 47 and 48 are still open. Thus, the first, fourth and fifth transistors 49, 51 and 52 are kept turned on to hold the control values as long as a voltage (+Vcc) of a power source of the IC is supplied to the transistors. The voltage application to the second and third pads 45 and 46 is carried out in an inspection process at a fabrication step before molding the IC and is executed by a control by using a tester. Hence, after the completion of the IC, no control or adjustment is required.

In this embodiment, the minimum value (0, 0, 0, 0, 0) and the maximum value (1, 1, 1, 1, 1) of the digital signals are not used because the variation amounts of their frequency deviation become large.

As described above, according to the present invention, the frequency control of the FM modulator can be carried out without requiring the external parts and extra or particular pins to be connected to the IC and a fabrication process can be simplified. In particular, according to the present invention, the value of the frequency deviation can be changed almost linearly depending on the digital signals and the control can be readily carried out.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A frequency control circuit of a frequency modulator, comprising:
   (a) a non-linear digital-analog converter including a plurality of resisters, each resistor having a resistance substantially equal to a consecutive $K^n$ multiple of a unit resistance, wherein K represents a positive real number and n represents a consecutive natural number for giving an analog resistance value depending on a digital frequency control;
   (b) a current generator coupled to the non-linear digital-analog converter for generating a current $\Delta I$ depending on the resistance value of the non-linear digital-analog converter, wherein the current $\Delta I$ varies substantially in inverse proportion to changes in the analog resistance value; and
   (c) an FM modulator for receiving an input signal having maximum amplitude and a minimum amplitude, the FM modulator having a voltage generating resistor $R_b$ coupled to said current generator through which the current $\Delta I$ flows and a capacitance C, the FM modulator being responsive to the current $\Delta I$ from the current generator for generating an oscillating signal having an oscillating frequency substantially propositional to $1/C\Delta IR_b$, and producing a frequency deviation in the oscillating signal from when an input signal-having a minimum amplitude is applied to when an input signal having a maximum amplitude is applied, wherein the frequency deviation varies as a voltage drop across the voltage generating resistor $R_b$ and varies substantially linearly with changes in the digital frequency control.

2. The circuit of claim 1, wherein K is a real number satisfying 1<K<2.

3. The circuit of claim 1, wherein the non-linear digital-analog converter further includes a plurality of switches, each switch being coupled in series to a respective resistor of said plurality of resistors and each of the respective resistors is coupled to the current generator.

4. The circuit of claim 3, wherein the state of each of the switches as ON or OFF is actuated by zapping, and wherein a current source is connected to or disconnected from the respective resistors depending on the state of the switch.

5. The circuit of claim 3, wherein each of the plurality of switches includes:
   a switch transistor having a base terminal, a collector terminal and an emitter terminal, the base terminal being coupled to a power source, the collector terminal being coupled to one of the respective resistors of said plurality of resistors, and the emitter terminal being coupled to a ground;
   a diode connected, in a direction of reverse bias, between the base terminal and the emitter terminal of the switch transistor; and
   a control pad connected to one end of the diode, wherein the digital frequency control signal is applied to the control pad to actuate the switch transistor.

6. The circuit of claim 5, wherein the digital frequency control signal determines the frequency deviation.

7. The frequency control circuit of claim 1, the frequency control circuit further including a synchronous signal lower end frequency control circuit for supplying a central frequency current to the FM modulator for determining a central frequency of the oscillating signal, wherein
   the frequency deviation is determined by the current $\Delta I$ independent of the central frequency determined by the central frequency current.

8. A frequency control circuit of a frequency modulator comprising:
   (a) a non-linear digital-analog converter including a plurality of resistors, each resistor having a resistance substantially equal to a consecutive $K^n$ multiple of a unit resistance, wherein K represents a positive real number and n represents a consecutive natural number, for giving an analog resistance value depending on a digital frequency control;
   (b) a current generator coupled to the non-linear digital-analog converter for generating a current $\Delta I$ depending on the resistance value of the non-linear digital-analog converter, wherein the current $\Delta I$ includes a predetermined minimum current $\Delta I_1$ and available current $\Delta I_2$ having a magnitude substantially proportional to the magnitude of the current flowing through the non-linear digital-analog converter; and
   (c) a an FM modulator for receiving an input signal having maximum amplitude and a minimum amplitude, the FM modulator having a voltage generating resistor $R_b$ coupled to said current generator through which the current $\Delta I$ flows and a capacitance C, the FM modulator being responsive to the current $\Delta I$ from the current generator for generating an oscillating signal having an oscillating frequency substantially proportional to $1/C\Delta IR_b$, and producing a frequency deviation in the oscillating signal from when an input signal having a minimum amplitude is applied to when an input signal having a maximum amplitude is applied, wherein the frequency deviation varies as a voltage drop across the voltage generating resistor $R_b$ and varies substantially linearly with changes in the digital frequency control.

9. The circuit of claim 8, wherein K is a real number satisfying an equation 1<K<2.

10. The circuit of claim 8, wherein the non-linear digital-analog converter further includes a plurality of switches, each switch being coupled in series to a respective resistor of said plurality of resistors and each of the respective resistors is coupled to the current generator.

11. The circuit of claim 10, wherein the state of each of the switches as ON or OFF is actuated by zapping, and wherein a current source is connected to or disconnected from the respective resistors depending on the state of the switch.

12. The circuit of claim 10, wherein each of the plurality of switches includes:
   a switch transistor having a base terminal, a collector terminal and an emitter terminal, the base terminal being coupled to a power source, the collector terminal being coupled to one of the respective resistors of said plurality of resistors, and the emitter terminal being coupled to a ground;
   a diode coupled, in a direction of reverse bias, between the base terminal and the emitter terminal of the switch transistor; and
   a control pad connected to one end of the diode, wherein the digital frequency control signal is applied to the control pad to actuate the switch transistor.

13. The circuit of claim 12, wherein the digital frequency control signal determines the frequency deviation.

14. The frequency control circuit of claim 8, the frequency control circuit further including a synchronous signal lower end frequency control circuit for supplying a central frequency current to the FM modulator for determining a central frequency of the oscillating signal, wherein
   the frequency deviation is determined by the current $\Delta I$ independent of the central frequency determined by the central frequency current.

15. A frequency control circuit of a frequency modulator, comprising:

(a) a non-linear digital-analog converter including a plurality of resistors, each resistor having a resistance substantially equal to a consecutive $K^n$ multiple of a unit resistance, wherein K represents a positive real number and n represents a consecutive natural number, for giving an analog resistance value depending on a digital frequency control;

(b) a current generator coupled to the non-linear digital-analog converter for generating a current $\Delta I$ depending on the resistance value of the non-linear digital-analog converter, the current generator including:

a first active device providing a minimum current;

a second active device for providing a variable current that varies based upon the resistance value of the non-linear digital-analog converter; and a circuit for combining the variable current and the minimum current to provide the current $\Delta I$; and (c) an FM modulator for receiving an input signal having a maximum amplitude and a minimum amplitude, the FM modulator having a voltage generating resistor $R_b$ through which the current $\Delta I$ flows and having a capacitance C, the FM modulator being responsive to the current $\Delta I$ from the current generator for generating an oscillating signal having an oscillating frequency substantially proportional to $1/C\Delta I$ and producing a frequency deviation in the oscillating signal from when an input signal having a minimum amplitude is applied to when an input signal having a maximum amplitude is applied, wherein the frequency deviation varies as a voltage drop across the voltage generating resistor $R_b$ and varies substantially linearly with changes in the digital frequency control.

16. The circuit of claim 15, wherein K is a real number satisfying an equation 1<K<2.

17. The circuit of claim 15, wherein the non-linear digital-analog converter further includes a plurality of switches, each switch being coupled in series to a respective resistor of said plurality of resistors and each of the respective resistors is coupled to the current generator.

18. The circuit of claim 17, wherein the state of each of the switches as ON or OFF is actuated by zapping, and wherein a current source is connected to or disconnected from the respective resistors depending on the state of the switch.

19. The circuit of claim 17, wherein each of the plurality of switches includes:

a switch transistor having a base terminal, a collector terminal and an emitter terminal, the base terminal being coupled to a power source, the collector terminal being coupled to one of the respective resistors of said plurality of resistors, and the emitter terminal being coupled to a ground;

a diode coupled, in a direction of reverse bias, between the base terminal and the emitter terminal of the switch transistor; and a control pad connected to one end of the diode, wherein the digital frequency control signal is applied to the control pad to actuate the switch transistor.

20. The circuit of claim 19, wherein the digital frequency control signal determines the frequency deviation.

21. The circuit of claim 15, wherein the combining circuit includes a first current mirror circuit providing a current referenced to the variable current.

22. The frequency control circuit of claim 15, the frequency control circuit further including a synchronous signal lower end frequency control circuit for supplying a central frequency current to the FM modulator for determining a central frequency of the oscillating signal, wherein the frequency deviation is determined by the current $\Delta I$ independent of the central frequency determined by the central frequency current.

* * * * *